US005410301A

United States Patent [19]

Dawson et al.

[11] Patent Number: 5,410,301

[45] Date of Patent: Apr. 25, 1995

[54] STATUS MONITORING SYSTEM FOR AN ELECTRONIC LOCK

[75] Inventors: Gerald L. Dawson; Craig B. Williams, both of Lexington, Ky.

[73] Assignee: Mas-Hamilton Group, Lexington, Ky.

[21] Appl. No.: 981,052

[22] Filed: Nov. 24, 1992

[51] Int. Cl.[6] .......... G06F 7/04; E05B 49/04; H03K 17/94; H03M 5/02

[52] U.S. Cl. .......... 340/825.31; 340/825.17; 340/547; 70/278; 341/35

[58] Field of Search .......... 340/825, 825.06, 825.17, 340/825.31, 825.32, 825.56, 506, 510, 524, 525, 536, 537, 542, 547, 825.34; 341/35; 361/171, 172; 70/276, 277, 278

[56] References Cited

U.S. PATENT DOCUMENTS

| | | | |
|---|---|---|---|
| 3,599,454 | 8/1971 | Hill et al. | 70/277 |
| 3,803,575 | 4/1974 | Gotanda | 340/542 |
| 3,838,395 | 9/1974 | Suttill, Jr. et al. | 340/825.31 |
| 3,851,314 | 11/1974 | Hedin | 361/172 |
| 3,878,511 | 4/1975 | Wagner . | |
| 4,148,092 | 4/1979 | Martin | 361/172 |
| 4,163,215 | 7/1979 | Iida | 340/825.31 |
| 4,227,180 | 10/1980 | Yasuda et al. | 340/825.17 |
| 4,392,133 | 7/1983 | Lundgren | 340/825.56 |
| 4,415,893 | 11/1983 | Roland et al. | 340/825.31 |
| 4,519,228 | 5/1985 | Sornes | 70/278 |
| 4,698,630 | 10/1987 | Ellsberg | 340/825.34 |
| 5,003,800 | 4/1991 | Bublewicz | 70/264 |
| 5,021,776 | 6/1991 | Anderson et al. | 340/542 |
| 5,061,923 | 10/1991 | Miller et al. | 341/35 |

FOREIGN PATENT DOCUMENTS

| | | |
|---|---|---|
| 0361881 | 4/1990 | European Pat. Off. . |
| 0475866 | 3/1992 | European Pat. Off. . |
| 2151580 | 4/1973 | France . |

OTHER PUBLICATIONS

Mas-Hamilton Group; Product Literature, "Make Your Safe the Safest with the X-07"; undated; USA.

Mas-Hamilton Group; Product Literature, "X-07 Features"; undated; USA.

Mas-Hamilton X-07 Lock available from Mas-Hamilton Group, Lexington, Ky. (undated).

*Primary Examiner*—Donald J. Yusko
*Assistant Examiner*—Mark H. Rinehart
*Attorney, Agent, or Firm*—Laurence R. Letson

[57] ABSTRACT

A monitoring and control system is disclosed which samples a plurality of output ports and lines from the microprocessor and the system electronics of an electronic lock to determine whether the bolt is extended, retracted, or the enabling stepper motor has been activated. The presence of a change key may be monitored and the efficacy of a change key controlled to only permit the changing of the combination of the lock when the central monitoring station approves such a change.

11 Claims, 5 Drawing Sheets

STATUS MONITORING SYSTEM FOR AN ELECTRONIC LOCK

FIELD OF THE INVENTION

This invention relates to electronic locks, specifically electronic combination locks, and more specifically to a status monitoring system which is capable of identifying the status and stage of operation of the electronic lock, to a remote monitoring/authorization control center.

BACKGROUND OF THE INVENTION

In highly sensitive security environments, it is desirable to be able to monitor from a central monitoring station, the status of combination locks and specifically electronic combination locks on security containers. In order to control access to the lock and to be aware that the container is being opened, it may be desirable to monitor remotely that the lock is being operated, the lock is in a locked state, or whenever the lock is in an unlocked state. It is further desirable to be able either to authorize or to prevent the use of a change key to cause the combination to be changed on the lock. If an authorized individual with an authorized combination has uncontrolled access to the lock, it might be possible for that individual to open the lock, re-set the combination, and close the lock without any control or supervision. Further, it might be possible while the security container was open for an unauthorized operator to change the combination. However, it is desired that the lock only be conditioned to change the combination when the central security monitoring center is aware of and/or authorizes any changes in the combination. By having the capability to monitor the operation/status of the lock from a remote location, it is possible to respond when the lock is being operated at a time when no authorized personnel are to be in the vicinity of the container. The security personnel can respond should the monitoring system indicate that the lock is being operated at an unexpected time or under unexpected circumstances.

SUMMARY OF THE INVENTION

By providing a lock such as the Mas-Hamilton X-07 electronic combination lock, available from the Mas-Hamilton Group, Lexington, Ky., with additional electronic I/O ports that may be used in connection with the change key and ground connections already existing on the lock, electrical conductors may be attached to the electronic portion of the Mas-Hamilton X-07 or similar lock and then routed to a central monitor station. The lock may be modified to add circuits which provide signals to a remote monitoring station that will be interpreted to indicate the condition or status of the lock at all times. Other connections to the electrical system of the lock can provide signals to indicate other status conditions for various components of the lock. In addition, a position detector must be installed within the lock housing to indicate the position of the bolt to the monitoring station. A convenient way to indicate that position is to install in or on the bolt, a small magnet. This magnet may move into or out of effective range of a reed switch positioned closely thereto whenever the bolt is withdrawn. The reed switch will change its conductive state whenever the bolt is extended. The logic of the monitoring station then may poll the reed switch by impressing a voltage on one terminal thereof and detecting whether the voltage is pulled to ground. This test indicates the conductive state of the reed switch, and accordingly the position of the bolt.

The firing circuitry that provides control pulses to the stepper motor may be monitored by the monitoring station to determine that a firing signal has been sent to the stepper motor, thereby indicating that the stepper motor has been commanded to condition the lock to be opened. The presence of such a signal, would indicate that the lock has been conditioned for opening; conversely, the absence of such a signal would indicate that the lock has not been conditioned for opening. The stepper motor status signal which indicates that the motor has been fired is an indication that the lock is in an unsecured state. The lock is in an unsecured state even if the bolt is extended, since with the stepper motor fired, the dial may be turned to withdraw the bolt.

In addition, while the lock is being operated the change line is maintained at a voltage other than ground and may be monitored for that voltage. Detection of the voltage on the change line indicates whenever the lock is powered for operation.

By comparing the voltage on the change key authorization line to that of a reference voltage, the presence of a short condition connecting the comparator circuit to ground will indicate each time the change key is inserted into the change key port. The change key bridges a ground line to the change key authorization line and indicates an attempt to change the combination of the lock by pulling the change key authorization line to ground. With an appropriate control provided by the central monitoring station, the lock may be conditioned through the change key port and responsive to the change key authorization line to permit changes in the lock combination. Without the appropriate control from the central monitoring station, the lock would be unable to accept a new combination.

OBJECTS OF THE INVENTION

It is an object of the invention to electronically monitor the status of an electronic combination lock.

It is a further object of the invention to be able to control from a remote location the change in the combination of an electronic lock.

It is a further object of the invention at a remote location to detect the operation of a lock and to indicate the operation, of this lock.

The accomplishment of the objects of the invention and the enhancement of the security of an electronic combination lock may be better understood by reference to the drawings and the detailed description of the invention that follows.

DRAWINGS

DETAILED DESCRIPTION OF THE PREFERRED EMBODIMENT OF THE BEST MODE CONTEMPLATED BY THE INVENTORS FOR CARRYING OUT THE INVENTION

Figure 1:
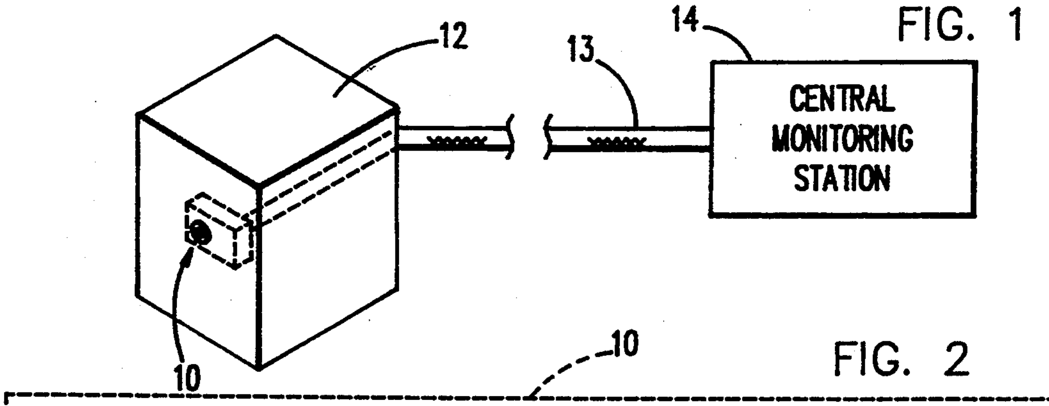
FIG. 1 illustrates a safe or vault having the lock of the present invention installed thereon and connected through a multi-conductor connector to a central monitoring station.

Referring to FIG. 1, a safe 12 is provided with a lock 10 of the type described herein. Lock 10 is connected through a cable 13 which is secured from unauthorized access, and extends to the central monitoring station 14.

Lock 10 by way of example, may be a Mas-Hamilton X-07 lock available from Mas-Hamilton Group, Lexington, Ky., modified as explained herein.

Figure 2:
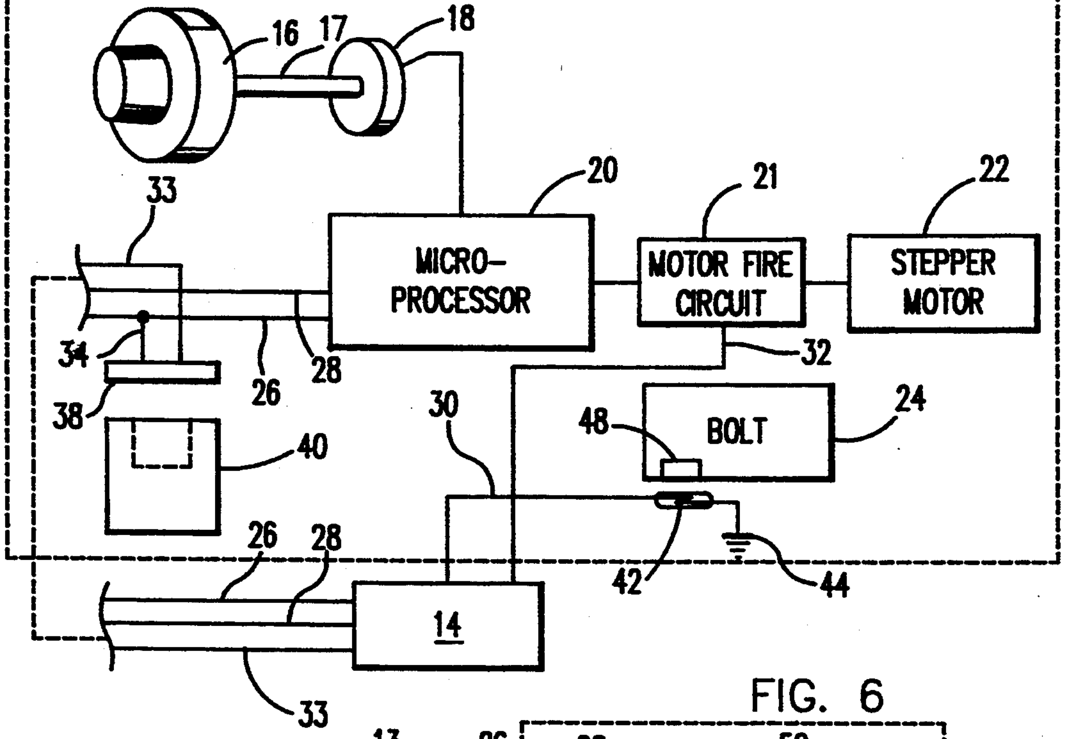
FIG. 2 illustrates the electronics of the lock and enhanced features of the electronic lock as described herein.

Referring now to FIG. 2, the lock 10 is depicted in FIG. 2 in its essential portions. Dial 16 is connected by shaft 17 to a stepper motor 18. The rotation of dial 16 and shaft 17 will cause the stepper motor 18 to rotate and generate a train of electrical pulses. The electrical pulses indicate the extent and direction of the rotation of dial 16 and are transmitted to the microprocessor 20 for use in determining the extent and direction of rotation of the dial 16. Microprocessor 20 is connected to a stepper motor 22 through a motor fire circuit 21. Circuit 21 accepts the motor fire signal from microprocessor 20 and outputs the necessary voltage signal to the motor 22 to cause it to step. When the lock 10 has received a valid combination and has determined that the lock 10 is to be opened, a signal is sent to the motor fire circuitry 21 by microprocessor 20 to cause the stepper motor 22 to step a predetermined angular displacement, thereby rotating an enabling member (not shown) into engagement with other mechanical parts (not shown) of the lock 10 to cause the lock 10 to be opened.

The microprocessor also is provided with an input/output interface which comprises lines 26 and 28. Line 26 is a ground connection, with line 28 being the change line connection.

In addition, the lock 10 provides two additional signal lines 30, 32 which along with lines 26, 28 connect with the central monitoring station 14. Line 30 indicates the position of the bolt 24 through the condition of the reed switch 42. Line 32 conducts the motor fire signal from the motor fire circuit 21 to the central monitoring station 14 or may be entered into a computer for use by a computer if the central monitoring station is so provided. These lines 26, 28, 30, 32 are connected to the central monitoring station 14 so that the data carried on those lines can be displayed for the visual or audible sensing by personnel of the central monitoring station 14. Line 26 may be further connected to line 34 which branches to an interface 38, the change key socket 38. This branch permits the connection of change key 40 between lines 34, 33 and permits signaling to the central monitoring station 14 that the change key 40 is engaged with socket 38.

Bolt 24 is movable from a first, extended position to a second, retracted position when the lock 10 is opened. The position of the bolt 24 may be detected by mounting a small magnet 48 in or on the bolt 24 and positioning a reed switch 42 in close proximity to one of the two positions that magnet 48 will occupy as bolt 24 is positioned in its respective extended or retracted positions. The preferred embodiment of this invention utilizes the magnet resident in the bolt of the Mas-Hamilton X-07 lock which is a portion of the magnetic interlock found in the X-07 lock.

One terminal of the reed switch 42 is connected by signal line 30 to the central monitoring station 14 and the other terminal of the reed switch 42 is grounded. Depending upon the state of the reed switch 42 which, in turn, is dependent upon the presence or absence of magnet 48 within an effective range, the reed switch 42 will convey to the monitoring station 14 information from which monitoring station 14 may determine the position of bolt 24.

During the operation of lock 10, the electrical energy provided to microprocessor 20 by the rotation of dial 16 from stepper motor 18 will lock power the lock and impress a voltage $V_{cc}$ on the change line 28. By monitoring change line 28, the central monitoring station 14 will detect either the presence or an absence of the voltage $V_{cc}$ on that terminal; and if the voltage $V_{cc}$ is present, the central monitoring station 14 will determine that the lock is powered and being operated. Accordingly, the voltage on line 28 can be used to indicate each time the lock 10 is being operated.

The voltage on change line 28 will disappear shortly after the lock 10 has been opened or ceased operation. Accordingly, the absence of the voltage signal indicates that the lock 10 currently is not being operated but does not indicate conclusively that the lock is secure. When the change key 40 is inserted into interface 38 and the change key authorization control 54 is activated by closing switch 53, the voltage $V_{cc}$ on line 28 will disappear but does not pose a security problem since an authorized combination change is in progress.

Stepper motor 22 is controlled by a signal from the microprocessor 20 anytime the lock 10 is to be conditioned for opening. The central monitoring station 14 in turn, monitors the motor fire circuitry 21 which sends this signal to the stepper motor 22; and whenever the motor fire circuitry 21 produces the firing signal for stepper motor 22, the central monitoring station 14 receives over line 32 the same signal that the lock 10 has been conditioned to be unlocked and, therefore, is considered to be unlocked even if the final step of withdrawal of the bolt 24 has not occurred. The monitoring station 14 will continue to exhibit an "UNLOCKED" condition until the bolt is withdrawn and extended again.

The remaining signal conductor 30 is used to transmit a signal from reed switch 42 to the central monitoring station 14, indicating the position of bolt 24 as determined by the continuity or lack of continuity exhibited by reed switch 42. The preferred embodiment of this circuit incorporates a normally closed reed switch 42, connected to electrical ground 44, which is magnetically opened upon bolt 24 withdrawal. This insures that if the cable 13 is cut the monitoring station 14 will reflect an unlocked or unsecured status. With the information carried on lines 30, 32, the status of the lock 10 may be determined to be either unlocked or locked.

The central monitoring station 14 may include a microprocessor either in the form of a stand-alone specially designed computer or may be included within a general purpose computer which is adapted to receive signals of a binary nature provided by microprocessor 20 and also is programmed to interpret the signals and provide a visual or audible output for the understanding of the operator. In the interests of costs and simplicity, the central monitoring station 14 preferably is provided with logic which may be designed a skilled logic designer and which continuously cycles to monitor the data or status on lines 26, 28, 30 and 32, as will be described later.

Figure 7:
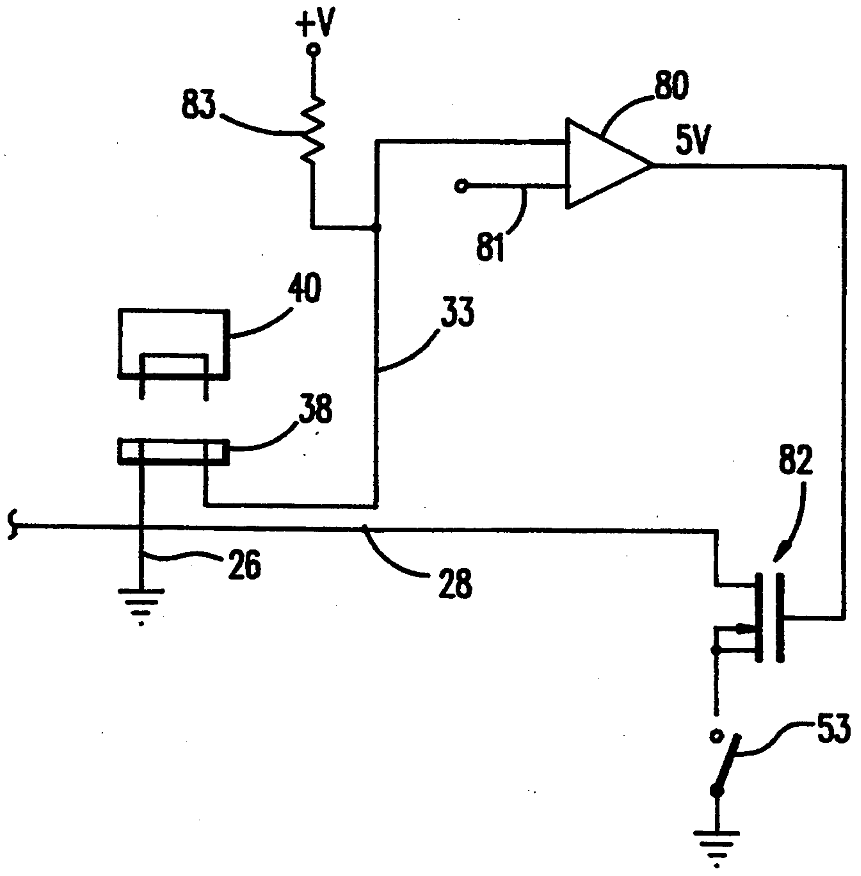
FIG. 7 is a logic circuit diagram of the circuit to detect the presence of the change key and to authorize the change key usage.

Referring to FIG. 7, change key 40 may be inserted into interface 38 to condition microprocessor 20 in order to change the combination of the lock 10. The change key 40 is a jumper shorting conductor which shorts the ground line 26 and conductor 34 to the change key authorization line 33 which extends from the central monitoring station 14. When the change key authorization line is shorted to ground by change key 40, +V voltage normally resident on line 33, supplied by +V on one terminal of pull up resistor 83, is pulled to ground and the voltage drops below $V_{ref}$ on terminal 81 of the operational amplifier 80 used as a voltage comparator. With line 233 carrying a voltage lower than $V_{ref}$, comparator 80 outputs a 5 volt signal to the transistor 82, causing it to conduct, thereby providing a path for change line 28 to be grounded when monitoring station authorization switch 53 is closed. The central monitoring station 14 may thus determine by the voltage level on the change key authorization line 33 whether or not a short exists between lines 26 and 33; thereby also determining whether the change key 40 is engaged with socket 38. If the change key 40 is in position, in socket 38, the shorting condition will be apparent to the central monitoring station 14 by virtue of the low voltage on line 33, compared to the voltage $V_{ref}$ on terminal 81 of comparator 80. To discover that a potential above $V_{ref}$ exists on line 33 means no short exists, and that the change key 40 is not installed.

The central monitoring station 14 controls the efficacy of change key 40 by controlling the change line 28. Control 54 comprises a switch through which line 28 may be connected to ground if transistor 82 is conductive, responsive to a low or ground potential on line 33. The control 54 may be electronic or mechanical as desired. As discussed above, the presence of the change key 40 in the interface 38 is detected by testing and discovery of a shorted condition between lines 26 and 33. When shorted and when line 33 is grounded, the circuit of FIG. 7 indicates that the change key 40 is resident in the interface 38. If the change key 40 is installed in the interface 38 of lock 10 and the change line enabled by the central monitoring station 14, through control 54 the change line 28 is pulled to ground and no voltage potential will appear on line 28. If the change key 40 is not enabled by the central monitoring station 14, then the change line 28 is unaffected and changing the combination is prevented. With the change line 28 not pulled to ground, any effort to change the combination of lock 10 will be ineffective and prohibited since the microprocessor will not recognize the change key 40 and will not enter the change combination routine of the lock 10.

The change line 28 may be further used additionally for the conveyance of an alarm signal if the lock 10 has an alarm capability. Should the operator enter a combination where the last number entered is offset from the last number of the authorized combination by a known amount (for example ten units larger), the microprocessor 20 will recognize this number as a valid combination number but will also send an alarm signal to the central monitoring station 14 to indicate that the lock 10 has been operated and that the alarm signal triggering combination has been used. The use of the alarm signal triggering combination may convey that the lock is being operated by the operator under conditions of duress including a potential robbery.

Figure 3:
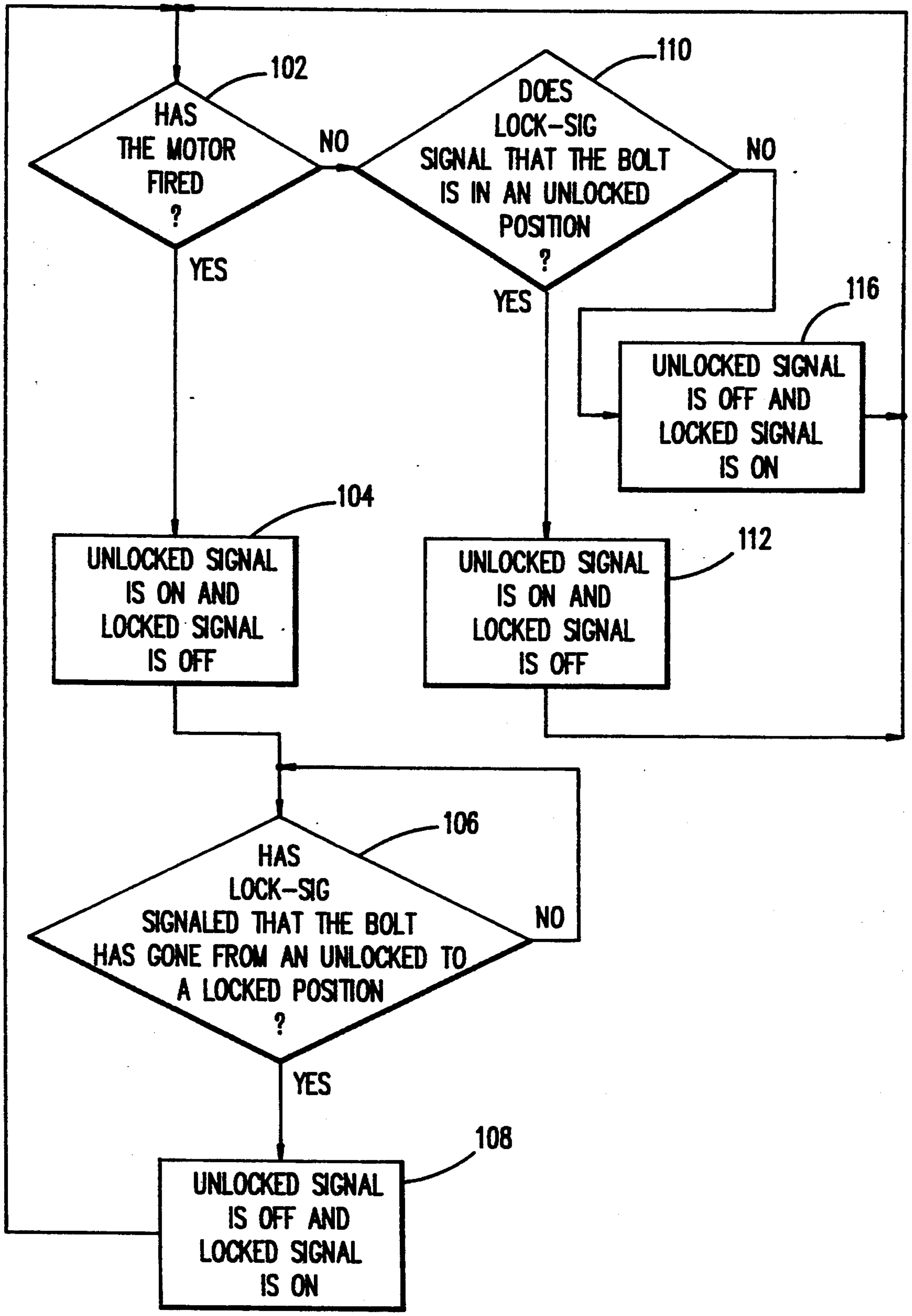
FIG. 3 is a logic control flow diagram which controls the microprocessor to monitor the firing signal for a stepper motor and the bolt, position.
Figure 4:
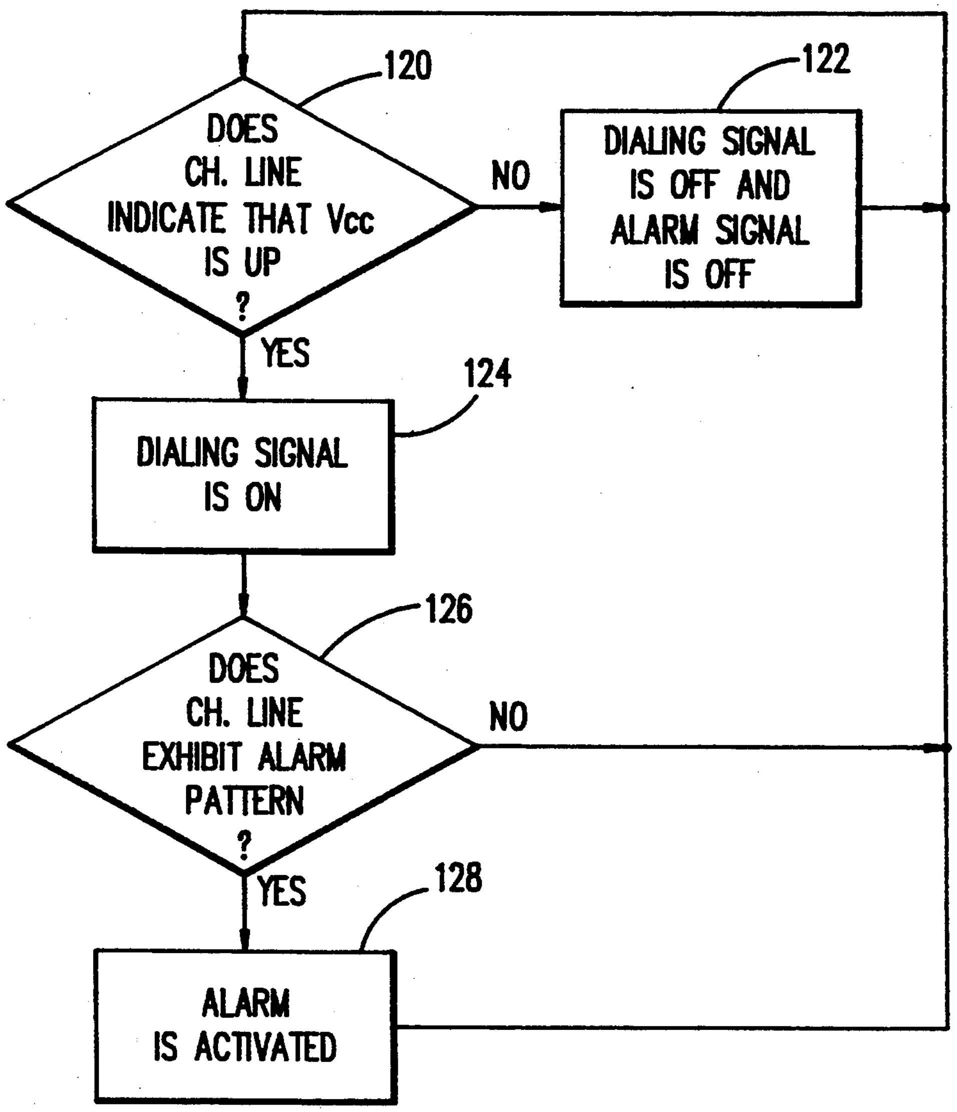
FIG. 4 is a logic flow diagram which shows how the central monitoring station may determine that the lock is being operated, except when the change line is intentionally grounded to enable the changing of the combination in the lock.
Figure 5:
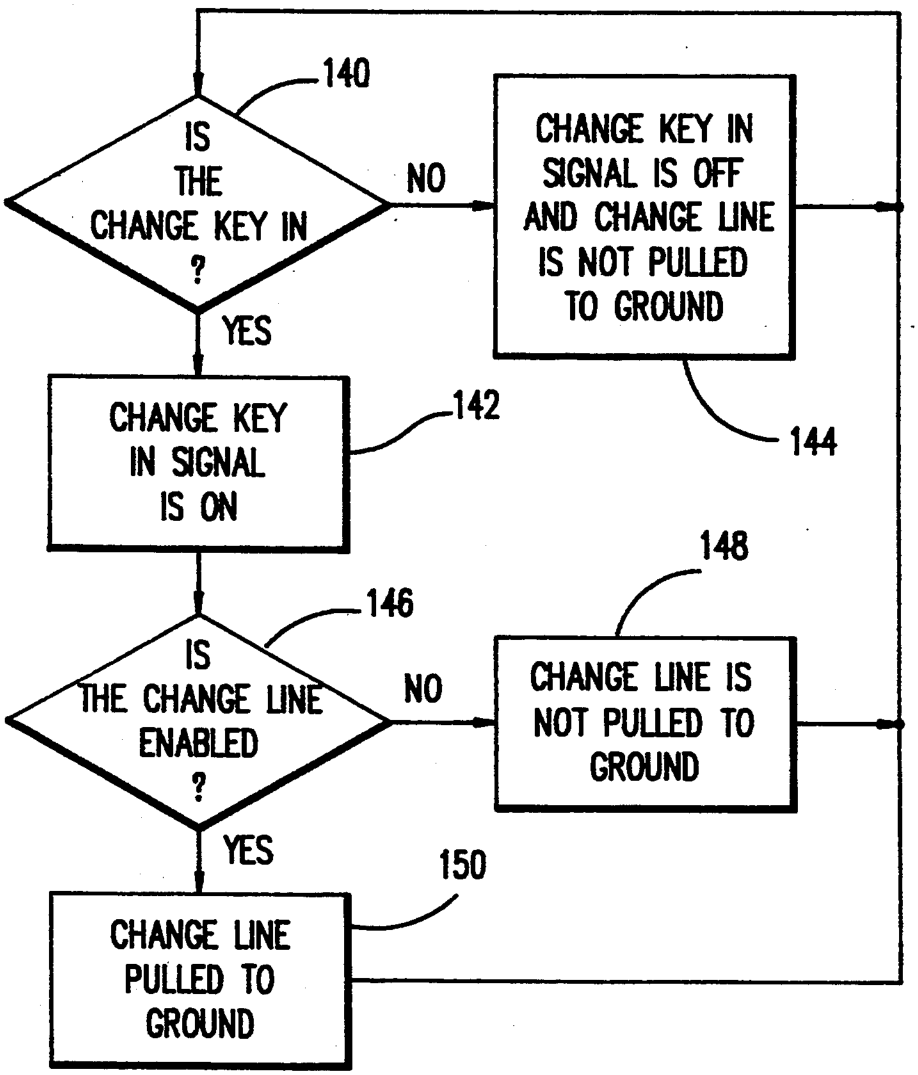
FIG. 5 illustrates a logic flow depicting logic functions of the central monitoring station which determine whether the change key has been connected into the change key port of the lock microprocessor, and whether the voltage on the change key port has been pulled to ground to effect a combination change on the lock.

Referring now to FIGS. 3, 4 and 5, the monitoring of lines 26, 28, 30, 32 and 33 will yield signals which are analyzed by the logic in a computer or microprocessor of the central monitoring station 14. It should be understood that this monitoring function preferably is hardwired in logic to accomplish the same decision making capability. The logic 50 is defined by and its operation ,illustrated by the logic flows in FIGS. 3, 4 and 5. The specific logic circuits may be fabricated by a logic designer of ordinary in the art by following the functional flow of FIGS. 3, 4 and 5.

Figure 6:
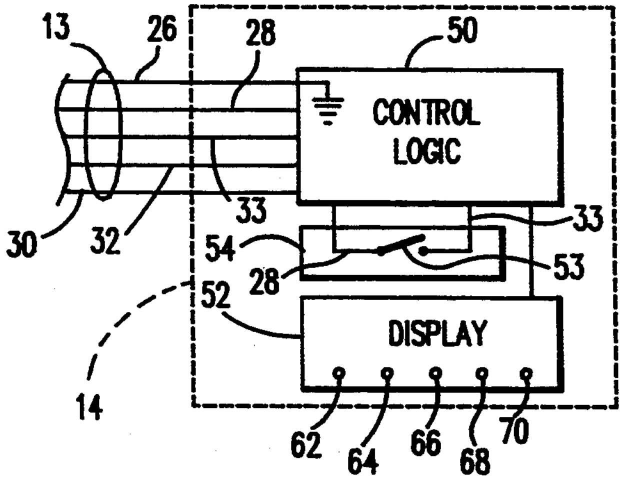
FIG. 6 illustrates the control logic, change authorization control and display panel of the central monitoring station.

Referring to the continuously running subroutine of FIG. 3, at operation 102 the decision is made as to whether the stepper motor 22 has been signaled to rotate or has been fired as it is referred to conventionally. This determination in operation 102 may yield an affirmative response; in which case the unlocked signal 62 is set and the locked signal 64 is turned OFF or reset on the central monitoring station panel, in operation 104. The unlocked signal and locked signal may be unlocked signal light 62 and locked signal light 64 on display 52, FIG. 6.

The flow of control then progresses to operation 106; the signal which is controlled by reed switch 42 in response to the bolt position, referred to as LOCK-SIG is tested and determined whether the LOCK-SIG indicates that the bolt 24 has translated from an unlocked to a locked position. In the event that the reed switch 42 signal indicates that the bolt 24 has been moved from the unlocked to the locked position, then the flow branches to operation 108 wherein the unlocked signal or light 62 is turned OFF and the locked signal or light 64 is turned ON. Should the decision in operation 106 be in the negative, then the control loops back and reenters operation 106 until such time as the control logic 50 receives a signal from the reed switch 42 in FIG. 2 to indicate that the bolt 24 has changed positions from the unlocked to the locked position.

After the completion of operation 108, the flow returns to re-enter operation 102. If the decision at operation 102, (whether the stepper motor has been fired) is in the negative, the flow branches to operation 110 wherein a determination is made as to whether LOCK-SIG signals that the bolt 24 is in a withdrawn position. If the bolt 24 is in an unlocked or withdrawn position and LOCK-SIG so indicates, then the unlocked signal is turned ON and the locked signal is turned OFF in operation 112. Thereafter, the flow loops back to operation 102. However if the decision in operation 110 is that the LOCK-SIG indicates that the bolt 24 is not in an unlocked position (extended) then, the unlocked signal is turned OFF and the locked signal is turned ON in operation 116 with light 62 extinguished and light 64 lit. Thereafter, the flow returns to operation 102.

If the routine of FIG. 3 is processed by a microprocessor in the central monitoring station 14, the microprocessor would require a program implementing the logic flow and operations of FIG. 3. However, such a program may be written by a programmer of ordinary skill in the art of programming. Accordingly a detailed program is not included herein.

Referring now to FIG. 4, the central monitoring station 14 control logic 50 monitors any signal on the change line 28 in FIG. 2. In operation 120, the change signal is sampled to see if a voltage potential is present on the change line 28. In the event that no voltage potential is present, then the dialing signal is turned OFF, light 66 extinguished; and the alarm likewise is turned OFF with the alarm lamp 68 extinguished. The absence of any voltage on the change line 28 indicates that lock 10 is inactive and has not been operated within the recent past.

Should the decision in operation 120 be in the affirmative, indicating that a voltage is present on the change line 28, then the dialing signal is turned ON and light 66 illuminated, indicating to the attendant of the central monitoring station 14 that the dial 16 is being rotated on lock 10. Operation 124 thus notifies the monitoring station personnel of activity in the lock 10.

Following operation 124, in operation 126 the voltage resident on the change line 28 is sampled and tested to determine whether it is a steady voltage or whether it is a varying voltage. If it is a varying voltage, (for example a 5 Hz. signal), the indication is that the lock 10 is being operated and that the combination which has been entered into the lock 10 has caused the lock 10 to set off an alarm.

If the voltage fluctuates at a 5 Hz. rate, for example, the alarm is activated; and the central monitoring station interprets the alarm signal in such a way that a light 68 is flashed or turned ON, or an alarm noise is sounded at operation 128, to attract the attention of the operator of the monitoring station 14. In the event that the alarm pattern is not present in the voltage present on change line 28, then the flow loops and re-enters operation 120. If the alarm is activated in operation 128, then the flow likewise loops to re-enter operation 120 and continuously loops to monitor the condition and voltages, if any, present on the change line 28.

Referring now to FIG. 5, the flow diagram is illustrated that represents the control logic functions for monitoring of the use of the change key 40 necessary to change the combination of the lock 10. The logic routine begins with operation 140. In operation 140 the circuit in FIG. 7 compares the change key authorization line 33 and its voltage with a reference voltage of, for example 2.5 V, to determine if the line 33 has been shorted to ground line 26 and if so the voltage comparator 80 will output a high or 5 V signal to transistor 82 to cause it to conduct. The high output of comparator 80 indicates the change key 40 is installed in interface 38. When transistor 82 is conductive, switch 53 may be closed to enable combination change.

If the change key 40 is not installed in the circuit, then the CHANGE KEY IN or CHANGE KEY PRESENT signal is turned OFF and the change key authorization line 33 voltage is not pulled to ground. When the change key authorization line 33 is not pulled to ground, then the combination of the lock 10 cannot be changed. Thereafter the flow re-enters operation 140 and continues to loop until such time as the change key 40 is determined to be present; in which case the decision that operation 140 is in the affirmative. The CHANGE KEY IN signal may be the output of comparator 80. This signal may be used to illuminate lamp 70 indicating that change key 40 is installed in interface 38, or to control other circuitry to control lamp 70.

Flow then branches to operation 142 where the CHANGE KEY IN or CHANGE KEY PRESENT signal is turned ON at the central monitoring station 14o This indicates to the central monitoring station operator that the change key 40 is installed in the lock 10; the operator of the central monitoring station 14 is aware then that an attempt is being made presently or may be made to change the combination of lock 10 in the immediate future. Thereafter the flow is to operation 146 to determine whether the change key 40 is enabled, thereby permitting the change of the combination of lock 10. If the change is not enabled by control 54 from central monitoring station 14, then the branch of the flow is to operation 148 where the change line 28 is not pulled to ground and, accordingly, lock 10 is prevented from allowing the combination to be changed.

After operation 148, the flow loops back and reenters operation 140 and continues monitoring sequences.

Should the determination be made in operation 146 that the key 40 is enabled by means of the change key authorization control 54 by closing a switch 53 at the central monitoring station 14, then the change line 28 is grounded and any voltage on that line 28 is pulled to ground, thereby permitting the operator of lock 10 to proceed then with the change to the combination.

FIG. 7 serves to disclose a hardwired circuit that will perform the functions illustrated in FIG. 5.

From the foregoing description, it can be readily understood that the connection of lock 10, FIG. 1, to a central monitoring station 14 will enhance the security provided by an electronic lock 10 which is located at a remote site some distance from the central monitoring station. This will provide continuous monitoring of the activity of the lock 10 as well as the condition of the lock 10 and permit the security or law enforcement personnel to be dispatched or other action taken should some unauthorized or unexpected activity occur with respect to the lock 10. The central monitoring station 14 is illustrated in more detail in FIG. 6. The signal lines 26, 28, 30, 32 and 33 extend to monitoring or control logic 50. Logic: 50 is typically provided with a display 52 in the form of a light panel and a change key authorization control 54 in the form of a switch. The control logic 50 may be part of a computer, computer terminal or electronic system or may be a dedicated microprocessor utilized solely for this function. The conditions detected on the lines 26, 28, 30, 32 and 33 are translated by the logic 50 into control signals and sent to the display 52 either to turn ON or turn OFF status lights 62, 64, 66, 68 and 70, activate a speaker and noise generating system, or display messages on a computer terminal or computer display. In order to control the change key function, the change key authorization control 54 may take the form of a switch 53 or, alternatively, may be a keyboard which may be manipulated to provide necessary inputs to a computer or microprocessor thereby causing the computer or microprocessor then either to connect line 28 to ground or to severe any connection between line 28 and ground, thereby permitting line 28 to carry a potential, and thereby preventing any combination change.

Modifications and changes of a minor nature may be made in the system as disclosed and should not remove any resulting apparatus from the scope of the claims appended hereto.

We claim:

1. A monitored electronic combination lock system comprising:

an electronic combination lock;

said lock comprising a microprocessor for controlling operations of said lock;

said lock further comprising a generator for providing electrical power and pulses to said microprocessor;

a bolt having an extended position and a withdrawn position;

an enabling means for enabling withdrawal of said bolt, controlled by said microprocessor to enable the withdrawal of said bolt to unlock said lock;

a means for monitoring said lock comprising a monitoring station;

a plurality of electrical conductors extending from said lock to said monitoring station;

at least a first one of said electrical conductors connected to electrical ground;

a second one of said plurality of electrical conductors connecting said lock and said monitoring station and maintained at a known voltage potential;

an interface connected to both said first one and said second one of said plurality of electrical conductors;

a shorting conductor connectable at said interface with said second one and said first one of said plurality of electrical conductors for enabling combination changes;

a third one of said plurality of electrical conductors connected to conduct an activating electrical signal provided to said enabling means to said monitoring station;

a fourth one of said plurality of said electrical conductors connected to a position responsive detector means for detecting a position of said bolt and said monitor station for providing electrical signals indicative of the positions of said bolt;

said monitoring station comprising means connected to and for monitoring each of said plurality of conductors for electrical signals indicating a state of a plurality of components of said lock;

a fifth one of said plurality of electrical conductors extending from said monitoring station and connected to said interface, said fifth one of said plurality of electrical conductors connected to a logic circuit for determining a presence of said shorting conductor at said interface extending between said fifth one and said second one of said plurality of electrical conductors; and said monitoring station comprising an authorization means for authorizing the use of said shorting conductor when said shorting conductor is connected to said second and said fifth of said conductors, thereby conditioning said lock to accept a change in operating parameters.

2. The lock system of claim 1 wherein said monitoring station further comprises a plurality of status indicators, controlled by said means for monitoring to indicate when said lock is in locked and unlocked states.

3. The lock system of claim 1 wherein said monitoring station further comprises an indicator controlled by said means for monitoring to indicate when said lock is being operated.

4. The lock system of claim 1 wherein said monitored system further comprises an indicator controlled by said monitoring station to indicate when said shorting conductor is connected to at least said second one of said plurality of electrical conductors.

5. The lock system of claim 1 wherein said authorization means comprises a switch intermediate said first one of said plurality of electrical conductors and ground, whereby said first of said conductors may be grounded when said shorting conductor is connected to said second one and said fifth one of said plurality of electrical conductors at said interface.

6. The system of claim 1 wherein said enabling means comprises a stepping motor.

7. The monitored lock system of claim 1 wherein said monitoring station comprises a logic means for detecting the occurrence of a control signal to said enabling means for enabling the opening of said lock and for generating a signal indicative of a locked or an unlocked condition of said lock.

8. The lock system of claim 1 wherein said monitoring station comprises logic means for determining positions of said bolt, responsive to signals on said fourth of said conductors, and for generating a signal indicative of a locked or unlocked condition of said lock and logic means for further indicating a locked condition when said control signal to said enabling means has not occurred and said bolt is in an extended position.

9. The lock system of claim 1 wherein said monitoring station comprises logic means for determining positions of said bolt, responsive to signals on said fourth of said conductors, and for generating a signal indicative of a locked or unlocked condition of said lock, wherein said logic means further indicates an unlocked condition when either said control signal to said enabling means has occurred or a signal on said fourth of said conductors indicates said bolt is in a withdrawn position.

10. The lock system of claim 1 wherein said means for monitoring comprises a logic means for detecting a voltage on said first of said conductors.

11. The lock system of claim 10 wherein said monitoring station further comprises an indicator controlled by said means for monitoring to indicate when said voltage is detected, whereby the operation of said lock is indicated.

* * * * *